United States Patent
Barr et al.

(10) Patent No.: US 6,940,288 B2
(45) Date of Patent: Sep. 6, 2005

(54) APPARATUS AND METHOD FOR MONITORING AND PREDICTING FAILURES IN SYSTEM INTERCONNECT

(75) Inventors: Andrew H. Barr, Roseville, CA (US); Ken G. Pomaranski, Roseville, CA (US); Dale J. Shidla, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 126 days.

(21) Appl. No.: 10/453,595

(22) Filed: Jun. 4, 2003

(65) Prior Publication Data

US 2004/0245996 A1 Dec. 9, 2004

(51) Int. Cl.[7] ............... G01R 31/08; G01R 31/02
(52) U.S. Cl. ............................. 324/525; 324/421
(58) Field of Search ................. 324/525, 512, 324/500, 421, 549, 691, 727, 519, 600, 754, 755, 713, 765, 158.1, 537; 702/58, 81

(56) References Cited

U.S. PATENT DOCUMENTS

| | | | | |
|---|---|---|---|---|
| 4,479,088 A | * | 10/1984 | Stopper | 324/525 |
| 4,565,966 A | * | 1/1986 | Burr et al. | 324/519 |
| 5,420,500 A | * | 5/1995 | Kerschner | 324/72.5 |
| 6,124,715 A | * | 9/2000 | Chakraborty | 324/537 |
| 6,453,248 B1 | * | 9/2002 | Hart et al. | 702/58 |
| 6,664,794 B1 | * | 12/2003 | Fieselman et al. | 324/525 |
| 6,677,744 B1 | * | 1/2004 | Long | 324/158.1 |
| 6,707,312 B2 | * | 3/2004 | Stave | 324/765 |
| 2004/0012078 A1 | * | 1/2004 | Hortaleza | 257/678 |

* cited by examiner

*Primary Examiner*—Anjan Deb
*Assistant Examiner*—Hoai-An D. Nguyen

(57) ABSTRACT

An apparatus and a method for detecting high impedance failures in system interconnects. The apparatus and method may measure resistance of a connection of one or more representative sets of pins on a partitioned chip to a circuit board and determine if the measured resistance of each of the one or more representative sets of pins is less than a threshold value. The measuring step is executed while the circuit board is operating.

21 Claims, 7 Drawing Sheets

APPARATUS AND METHOD FOR MONITORING AND PREDICTING FAILURES IN SYSTEM INTERCONNECT

BACKGROUND

High impedance connections in application specific integrated circuit (ASIC) attachments and connectors can cause system failures that are extremely difficult to predict and debug. Many new connector systems (such as sockets for ball or land grid array packages) are especially susceptible to co-planarity problems, which result in new failure modes as compared to pin and socket connectors. These failure modes present significant challenges to the design and manufacture of high quality systems. Currently there is no way to predict and proactively deal with such failure modes, since such faults don't always manifest themselves as pure 'opens,' which, by nature, are much easier to detect.

The failure modes that result from high-impedance connections vary widely from easily detectable bus errors to completely unpredictable behavior. When these types of failure modes have been seen, the typical 'solution' has been to keep swapping boards until the system starts to work again. Debugging has been done by taking resistance measurements by hand (using an Ohm meter) to determine interconnect resistance. Unfortunately, this method is extremely time-consuming and, in many cases, results in an inaccurate reading. It is also something that occurs 'after the fact.' A more precise 'in system' approach is needed.

SUMMARY

An advantage of the embodiments described herein is that they overcome the disadvantages of the prior art. Another advantage of certain embodiments is that they may detect if a pin failure occurs or pro-actively predict interconnect failures before the failures actually occur. Yet another advantage is that this prediction is accurate and performed automatically rather than manually or by hand. Still another advantage of certain embodiments is that they provide greater system uptime and a better customer experience. Another advantage of certain embodiments is that they provide means for monitoring the resistance of a representative sample of interconnect pins during operation and provide for logging the resistance information for use in debug or proactive fault management.

These advantages and others are also achieved by a method for detecting high impedance failures in system interconnects. The method preferably measures resistance of a connection of one or more representative sets of pins on a partitioned chip to a circuit board and determines if the measured resistance of each of the one or more representative sets of pins is less than a threshold value. The measuring step is executed while the circuit board is operating.

These advantages and others are also achieved by computer-readable medium that includes instructions for measuring resistance of a connection of one or more representative sets of pins on a partitioned chip to a circuit board and determining if the measured resistance of each of the one or more representative sets of pins is less than a threshold value. The measuring step is executed while the circuit board is operating.

DESCRIPTION OF THE DRAWINGS

The detailed description will refer to the following drawings, wherein like numerals refer to like elements, and wherein.

DETAILED DESCRIPTION

Figure 1:
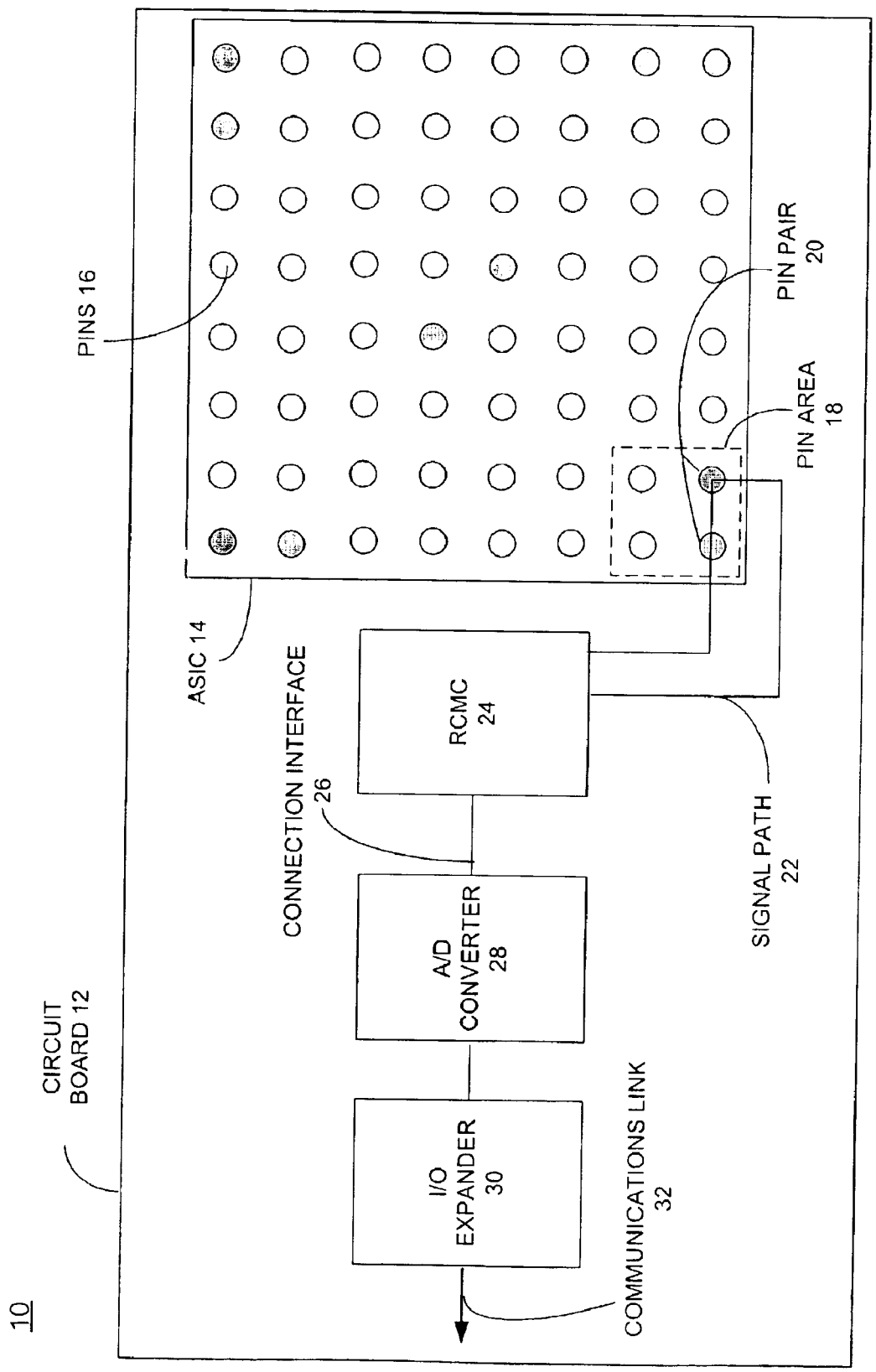
FIG. 1 shows a block diagram illustrating an embodiment of an apparatus for detecting high impedance failures in system interconnects.

FIG. 1 is a block diagram illustrating an embodiment of an apparatus 10 for detecting high impedance failures in system interconnects. System interconnects are the connections of chips into a computing system. High impedance in such circuit connections is directly correlated with the long term reliability of the connections. In other words, a circuit is more likely to fail as the connection increases from a 'direct short' (~0 ohms) to some degree of high impedance.

In the embodiment shown in FIG. 1, the interconnect of an application specific integrated circuit (ASIC) 14 with a system circuit board (e.g., a server motherboard) 12 is considered, although the inventive principles described herein may apply to other specific and general purpose chips that attach and interconnect with circuit boards. The attach mechanism for the ASIC 14 may be any variety of attach mechanisms that may experience localized interconnect issues. Many of such attach mechanisms that affect one pin of the ASIC 14 or other chip would likely affect other neighboring pins in a similar fashion. Examples of such attach mechanisms include, but are not limited to, ball grid array (BGA) attach, solder column attach, surface mount and other various socketing techniques and others.

With reference again to FIG. 1, an ASIC 14 that attaches to the circuit board 12 is shown. The ASIC 14 includes representative pins 16 that interconnect with the circuit board 12. The ASIC 14 may include more or less pins 16 than shown in FIG. 1. The apparatus 10 preferably includes a resistance continuity monitoring circuit (RCMC) 24, an analog-to-digital (A/D) converter 28, an input/output (I/O) expander 30, and a communications link 32 to the rest of the system (e.g., other system components on the circuit board 12) as depicted.

The RCMC 24 is an analog precision circuit that determines the current resistance value of the interconnect of the pins 16 with the circuit board 12. The RCMC 24 may be integrated with the A/D converter 28 as a combined circuit. In the embodiment shown in FIG. 1, the RCMC 24 is connected to the A/D converter 28 preferably with a short, low loss connection interface 26. The A/D converter 28 preferably converts the analog output signal of resistance measurement data from the RCMC 24 into a digital signal. The digital signal of the resistance measurement data from the RCMC 24 is preferably sent to the I/O expander 30. The I/O expander 30 communicates the digital signal of the resistance measurement data to system management devices (not shown) on the circuit board 12, or elsewhere, via the communications link 32. The communications link 32 is preferably a bus, for example, an I²C bus.

With continued reference to FIG. 1, the pins 16 of the ASIC 14 are preferably partitioned into pin areas 18 as shown. Preferably, all of the pins 16 are partitioned into pin areas 18 with a certain number of pins 16. For example, the pin areas shown are quadrants that include four pins 16. However, pin areas 18 with different numbers of pins 16 may be used. The number of pin areas 18 per chip can be chosen by balancing coverage versus cost of pin allocation. I.e., the greater number of pin areas 18 the more accuracy and better coverage. However, the cost of allocating the pins 16 into pin areas 18 increases as the number of pin areas 18 increases. The number of pin areas 18 may be reduced by partitioning only a subset of the pins 16 into pin areas 18 and/or by increasing the number of pins 16 in each pin area 18.

Each pin area 18 preferably has a representative monitored set of pins. In the present embodiment, these monitored set of pins are illustrated as the shaded pin pairs 20 seen in FIG. 1. In other embodiments, the representative monitored sets of pins may be different than a pin pair 20. For example, different patterns of pins may be selected as the representative monitored set of pins for all or some pin areas. The different patterns of pins may include more than the two pins in a pin pair 20. The possible representative monitored sets of pins vary depending on the size and number of the partitioned pin areas.

The pin pairs 20 are preferably connected to the RCMC 24 via a signal path 22 so that the RCMC 24 can monitor and measure the resistance of each pin pair 20 interconnect, as shown in FIG. 1. Each pin pair 20 is preferably connected to the RCMC 24 via a separate signal path 22. Alternatively, the pin pairs 20 may be connected to the RCMC 24 via a single signal path 22 connecting all the pin pairs 20 or by multiple signal paths 22 at least some of which connect a plurality of pin pairs 20. However implemented, the signal path 22 is preferably accomplished through routing on the ASIC 14 to connect the pin pairs 20 and routing a trace on the circuit board 12 to form a closed loop of daisy-chained pins 16 (or pin pairs 20 if connecting more than one pin pair 20 in the signal path 22).

In using the apparatus 10 for detecting high impedance failures, the assumption is that the interconnect resistance measurements of the representative monitored set of pins in a pin area 18, e.g., pin pair 20, apply to the other pins 16 in tie pin area 18. In other words, the conditions of the pin pair 20, as determined from the resistance measurements, are likely also the conditions of the other pins 16 in the pin area 18. Therefore, if the resistance measurements of the pin pair 20 interconnect indicates an imminent failure, the other pins 16 in the pin area 18 are likely also imminently failing.

The RCMC 24 measures the resistance of the entire signal path 22, including the resistance of the pin pairs 20 interconnects and the trace on the circuit board 12. Preferably, the resistance of the trace is minimized so that measured resistance is the resistance of the pin pairs 20 interconnect. The resistance of the pin pair 20 interconnect is the resistance to a signal flowing from the circuit board 12 to the ASIC 14 through the pin pair 20. Alternatively, the resistance of the trace is known and normalized out of the measurement.

The measured resistance data of the pin pair 20 interconnect is then transmitted to system management devices, as described above, for further processing. For example, other components on the circuit board 12, including, for example, a processor (not shown) executing instructions stored in memory (not shown), may receive the resistance data via the communications link 32 and perform various algorithms on the resistance data. For example, the measured resistance data may be compared to known values of pin pair 20 interconnect resistance. These known values, for example, may specify the optimal resistance for the pin pair 20 interconnect. If the measured resistance data is greater than the optimal values, it may be determined that an interconnect failure is imminent. In principle, as the resistance increases, the likelihood of failure increases. Other values may specify points at which the resistance indicates that the failure is likely imminent within a certain amount of time or at which the resistance indicates a failure has already occurred. These values may be determined through experimentation and/or provided by the ASIC 14 manufacturer.

If the measured resistance data indicates that a failure is imminent or has occurred, appropriate action can be taken (e.g., replacing the pins 16 in the pin area 18, replacing the ASIC 14, etc.). The measured resistance data may also be logged over time for further study and analysis.

Figure 2:
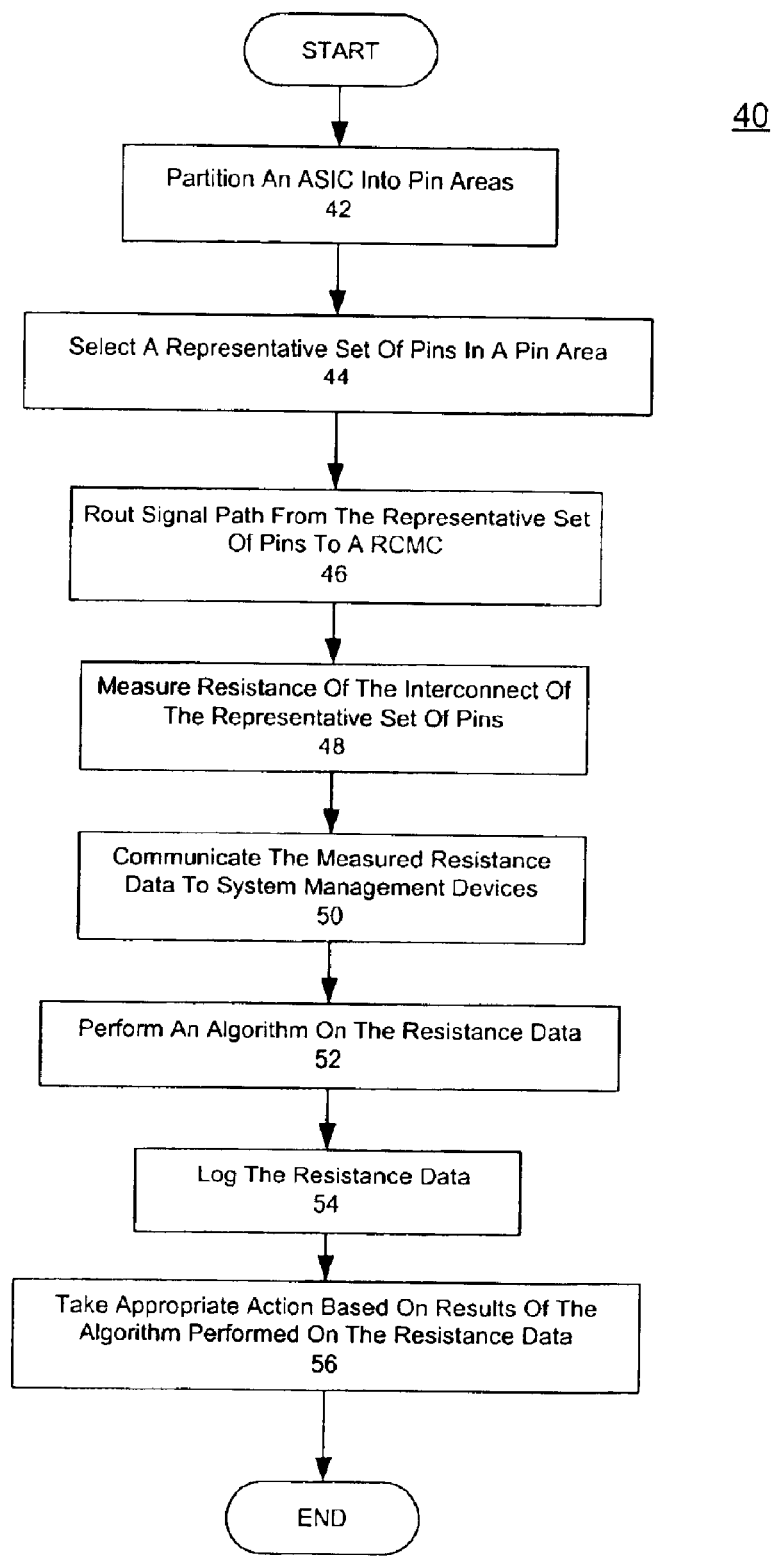
FIG. 2 is a flowchart illustrating an embodiment of a method for detecting high impedance failures in system interconnects.

FIG. 2 is a flowchart illustrating a method 40 for detecting high impedance failures in system interconnects. As shown, the method 40 includes partitioning an ASIC (or other chip) into pin areas (step 42), selecting a representative set of pins in a pin area (step 44), routing a signal path from the representative set of pins to a RCMC (step 46), measuring resistance of the interconnect of the representative set of pins (step 48), communicating the measured resistance data to system management devices (step 50), performing an algorithm on the resistance data (step 52), logging the resistance data (step 54), and taking appropriate action based on results of the algorithm performed on the resistance data (step 56). These steps may be performed as described above, for example. The algorithm preferably determines whether a high impedance failure is imminent (e.g., due to the resistance data values exceeding a threshold value). Steps 42–46 are preferably performed during the design phase. Steps 48–56 are preferably performed while the system (e.g., including the board 12 and the ASIC 14) is running. Moreover, steps 48–56 may be repeated as often as desired.

Figure 3A:
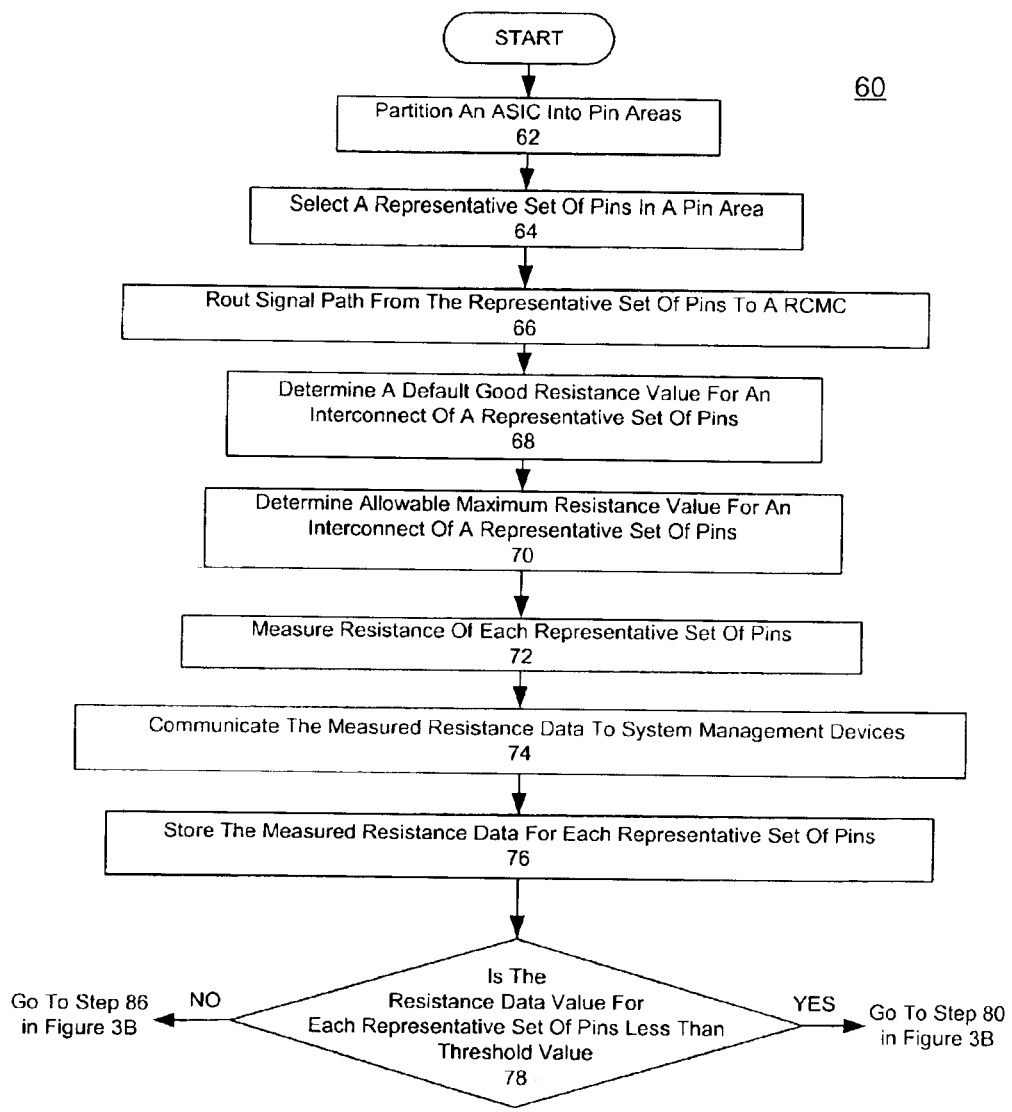
FIGS. 3A and 3B are a flowchart illustrating another embodiment of a method for detecting high impedance failures in system interconnects.
Figure 3B:
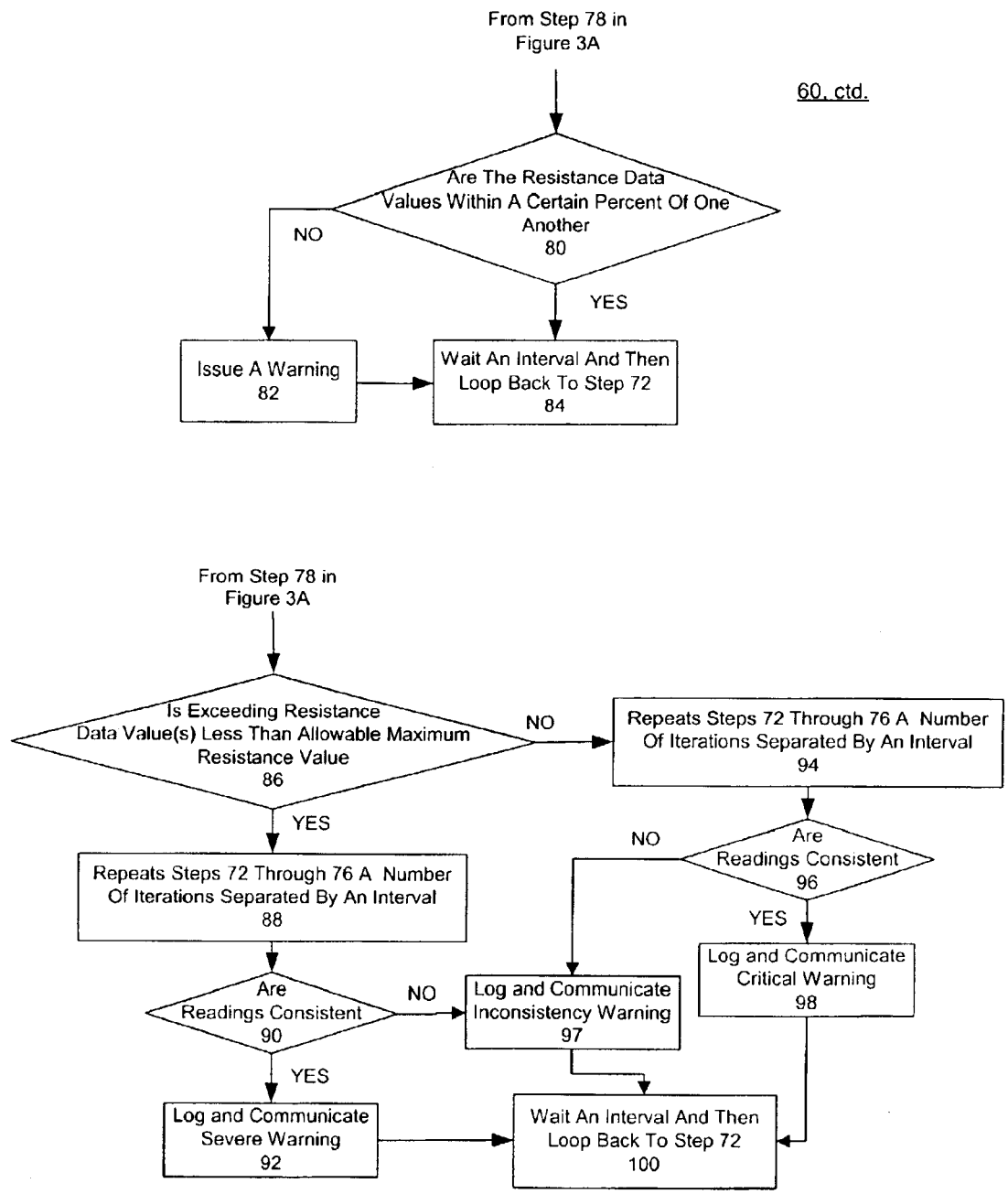

FIGS. 3A and 3B are a flowchart illustrating another method 60 for detecting high impedance failures, imminent or existent, in system interconnects. As shown, the method 60 includes partitioning an ASIC (or other chip) into pin areas (step 62), selecting a representative set of pins in a pin area (step 64), and routing a signal path from the representative set of pins to a RCMS (step 66). As described above, steps 62–66 are preferably performed during the design phase. The partitioning step 62 preferably partitions a subset of the pins 16 of the ASIC 14 in the pin areas 18. For example, the partitioning step 62 may partition five (5) groups of the pins 16 of the ASIC 14 shown in FIG. 1 into five (5) pin areas 18, each including four (4) pins 16. Since pin 16 failures most likely will occur in the corners of the ASIC 14, the five pin areas 18 are preferably partitioned in the comers plus the center/middle of the ASIC 14. Steps 64 and 66 are preferably performed as described above.

With continued reference to FIG. 3A, the method 60 further comprises determining a default good resistance value (x) for an interconnect of a representative set of pins (e.g., pin pair 20) (step 68). The default good resistance value (x) is preferably determined based on system simulation and board characterization. System simulation may include modeling the physical structure of the pin interface and simulating that structure to get the expected resistance for normally functioning pins. Board characterization may include building a test board through a careful manufacturing process that had known good interconnect and then measuring some sample of the pins and perhaps using an average value. Additionally simulation could be performed to determine what resistance on a pin is required to accurate circuit performance. An allowable maximum resistance value (y) for an interconnect of a representative set of pins is determined (step 70). The allowable maximum resistance value (y) is the maximum resistance for an interconnect of the representative set of pins for an ASIC 14 to avoid an interconnect failure. Above the allowable maximum resistance value (y), the ASIC 14 will suffer a high impedance failure. The allowable maximum resistance value (y) is preferably determined experimentally and/or through simulation. Preferably, both experimentation and simulation are used to determine the allowable maximum resistance value (y). Further, steps 68 and 70 are preferably performed once for the ASIC 14, although they may be repeated as necessary to confirm the values x and y.

The method 60 further measures resistance of each representative set of pins (step 72), communicates the measured resistance data to system management devices (step 74) and stores the measured resistance data for each representative set of pins (step 76), e.g., as R1 through R5. The measured resistance data is preferably stored in a register that can be read by a system processor. The method 60 determines if the value of the resistance data for each representative set of pins (e.g., R1 through R5) is less than a threshold value, e.g., the sum of the good resistance value (x) and the allowable maximum resistance value (y) minus the good resistance value (x) divided by two (i.e., x+[(y−x)/2]) (step 78).

With reference now to FIG. 3B, if the resistance data values for each representative set of pins is less than this threshold value, the method 60 determines if the resistance data values are within a certain percent (e.g., preferably ten to twenty percent (10–20%)) of one another (step 80). If the resistance data values are not within the certain percent of one another, a warning, such as "impedance values do not match," is issued (step 82), the method 60 waits a certain period of time (e.g., preferably ten minutes), and then the method 60 loops back to step 72 (step 84). Issuing the warning preferably includes logging the warning in a log and may include communicating (e.g., printing, messaging or emailing) the warning to a system administrator, field representative or other person responsible for maintaining the system. If the resistance values are within the certain percent of one another, the method waits a certain period of time and loops back to step 72 (step 84). Both the certain percent in step 80 and the certain period of time in steps 82 and 84 may be variably set per the requirements of the system (e.g., if the tolerance of failures is extremely low, a lower percent and shorter period of time may be chosen).

With continued reference to FIG. 3B, if the resistance data value for any of the representative sets of pins is more than the threshold value in step 78, the method 60 determines if the resistance data value(s) that exceeded the threshold value is less than allowable maximum resistance value (y) (step 86). Alternatively, step 86 may check the resistance data value for each representative set of pins rather than just the exceeding resistance data values. If yes, the method 60 repeats steps 72 through 76 a certain number of iterations (i) (e.g., preferably ten iterations) separated by a certain interval (e.g., preferably one minute) (step 88) and determines if the resistance data readings are consistent (step 90). An exceeding resistance data value reading could be an anomaly caused by any number of things, such as thermal cycling or a measurement error, so the consistency of the readings is verified to ensure the reading is correct. Step 90 may be performed by determining if the resistance data value(s) continue to consistently exceed the threshold value (e.g., the resistance data value(s) exceed x+[(y−x)/2] more than 50% of the time). If the resistance data readings are consistent, then the data indicates that a interconnect failure may occur soon. Accordingly, a severe warning, such as "interconnect failure possible soon," is preferably logged and printed, or otherwise immediately communicated, to a system administrator, field representative or other person responsible for maintaining the system (step 92). If the resistance data readings are determined by step 90 to be inconsistent, then an inconsistency warning, such as "resistance measurements are inconsistent," is preferably issued (step 97).

If, however, the method 60 determines in step 86 that the resistance data value(s) exceed the allowable maximum resistance value (y), an interconnect failure may be imminent. Accordingly, the method 60 repeats steps 72 through 76 a certain number of iterations (i) (e.g., preferably ten iterations) separated by a certain interval (e.g., preferably one minute) (step 94) and determines if the resistance data readings are consistent (step 96). Step 96 is preferably performed by determining if the resistance data value(s) continue to consistently exceed the allowable maximum resistance (e.g., the resistance data value(s) exceed y more than 50% of the time). If the resistance data readings are consistent, a critical warning, such as "interconnect failure may be imminent," is preferably logged and printed, or otherwise immediately communicated, to a system administrator, field representative or other person responsible for maintaining the system (step 98). If the resistance data readings are determined by step 96 to be inconsistent, then an inconsistency warning, such as "resistance measurements are inconsistent," is preferably issued (step 97).

With continued reference to FIG. 3B, once the method 60 has executed the above steps as necessary, the method 60 preferably waits a certain interval (e.g., preferably ten minutes) and then loops back to step 72 (step 100). This step 100 represents the continued monitoring of the ASIC 14 interconnect in order to detect high impedance failures. Preferably, the loops back to step 72 described herein and above are repeated a number of times.

The severe and critical warnings in steps 92 and 98, respectively, may have different actions programmed when triggered. For example, a severe warning may trigger step 92 to send an email to the system administrator and a critical warning may trigger step 98 to page the system administrator. For either warning, however, the message is preferably coded with the appropriate severity and processed as per the applicable severity level response standard (e.g., Hewlett-Packard, Inc.'s EMS or SNMP standards). Once the warning is received, the system administrator preferably takes appropriate action (e.g., replaces the ASIC 14 or performs additional testing). Also note that the time intervals discussed above are generally smaller if the resistance data value exceeds the threshold value, although the time intervals may be variably set per the requirements of the system. Furthermore, the value of y may be modified per the requirements of the system. For example, if the failure tolerance for the ASIC 14 interconnect is extremely low, the value of y may be substantially lowered. Likewise, if the failure tolerance is higher and minimizing replacement costs is a greater concern, the value of y may be raised.

Figure 4A:
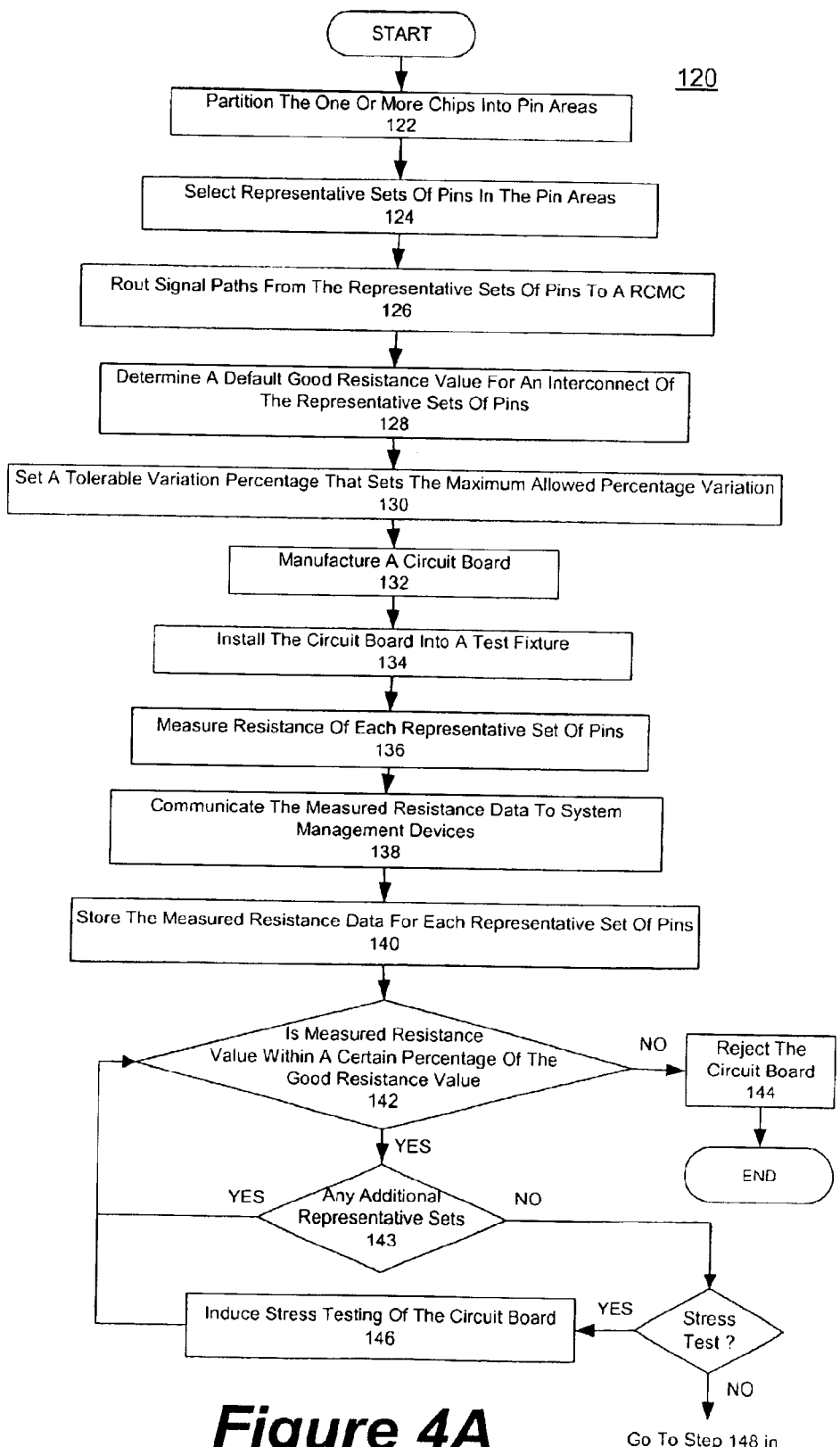
FIGS. 4A and 4B are a flowchart illustrating an embodiment of a method for detecting high impedance failures in system interconnects; and, FIG. 5 is a flowchart illustrating an embodiment of an apparatus including computer-readable medium with instructions for executing methods for detecting high impedance failures in system interconnects.
Figure 4B:
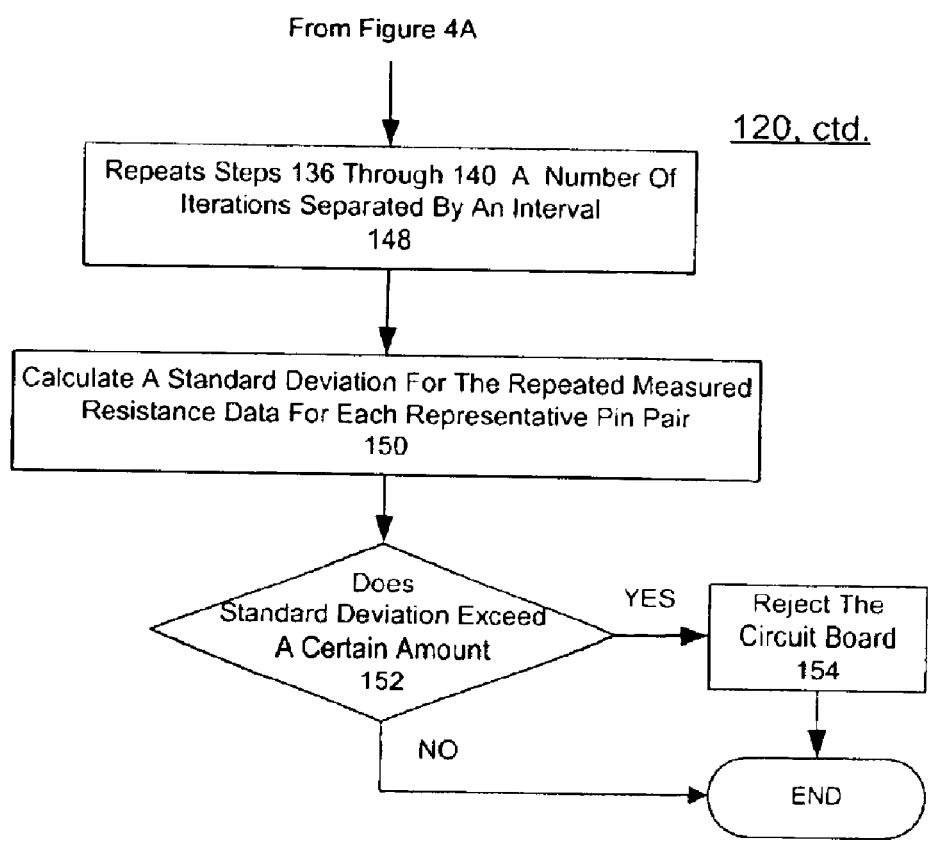

FIGS. 4A and 4B illustrate a method 120 for predicting, or detecting, high impedance failures in a system's interconnects, or in a single chip, preferably during the manufacturing process. The method 120 tests the system interconnects (e.g., an ASIC's connections) for the likelihood of interconnect failures and degradation in the field. Preferably, the method 120 is integrated into a standard manufacturing test process. In this manner, resistance measurements of representative pins can be taken 'on-the-fly' without manual intervention. The method 120 enables the evaluation of the quality of each interconnect before the system is shipped and enables a Find-and-Fix procedure for problem interconnects. The system may pass the other standard manufacturing test processes and still fail the method 120 test.

Typically, a circuit connection (i.e., a system interconnect) for a surface mount socket has a failure rate of about 0.25 FIT per contact (FIT=expected number of failures per billion hours of operation). By measuring the resistance of pin pair 20 interconnects, the manufacturer can verify that what leaves the factory meets this typical, and expected, failure rate. Generally, a resistance measurement of greater than 1 ohm is considered a failure and would, therefore, result in a field failure rate much greater than 0.25 fit per contact. This number varies widely, however, based upon the noise margins of the circuit.

With continuing reference to FIG. 4A, method 120 is illustrated as comprising partitioning the one or more chips into pin areas (step 122), selecting representative sets of pins in the pin areas (step 124), and routing signal paths from the representative sets of pins to a RCMS (step 126). These steps are preferably performed as described above for steps 62–66, with reference to FIG. 3.

The method 120 further comprises determining a default good resistance value (x) for an interconnect of the representative sets of pins (e.g., pin pair 20) (step 128). The default good resistance value (x) is preferably determined based on system simulation and board characterization. The method 120 may also include setting a tolerable variation percentage (z) that sets the maximum percentage variation from x allowed (step 130). The method 120 preferably further includes manufacturing a circuit board (step 132) and installing the circuit board into a test fixture (step 134). The manufacturing step 132 manufactures a circuit board (e.g., board 12) with one or more chips (e.g., ASIC 14) connected to the circuit board. Preferably, the circuit board, the test fixture or the chip include an apparatus for detecting high impedance failures in the circuit board interconnects (e.g., apparatus 10). The test fixture may run a standard testing code that includes instructions for executing the method 120.

The method 120 further comprises steps of measuring resistance of each representative set of pins (step 136), communicating the measured resistance data to system management devices (step 138) and storing the measured resistance data for each representative set of pins (step 140), e.g., as R1 through RN, where N is the number of representative sets of pins. The measured resistance data is preferably stored in a register that can be read by a system processor.

With continued reference to FIG. 4A, the method 120 preferably determines, for the representative sets of pins, whether the measured resistance value is within a certain percentage (e.g., z) of the good resistance value x (step 142). If yes, the method 120 preferably repeats step 142 for the next representative pins (step 143), if any. If no, the method 120 preferably rejects the circuit board (step 144). The rejecting step 144 may issue a warning (e.g., that the circuit board had an out-of-range resistance measurement). The method 120 may log the failure, e.g., indexed by the circuit board serial number, in a manufacturing database.

Many standard manufacturing test processes include stress testing of the circuit board. Stress testing is testing that is performed under any type of condition that induces additional stress on the circuit board. For example, stress testing includes, but is not limited to, testing the circuit board under extreme heat (e.g., in an oven), extreme humidity, extreme cold, shock-and-vibe (e.g., sudden jolts and vibration), extreme processing load (e.g., running programs), pattern stress testing (e.g., running code that loads and heats up one area of the circuit board), combinations of any of these, etc. Consequently, the method 120 preferably further includes stress testing of the board (step 146), which induces stress and repeats step 142 under the stress testing conditions.

In addition to determining if the resistance values of the representative sets of pins are within the certain percentage of x, the method 120 may include other testing algorithms. These other testing algorithms may be more complex or detailed than step 142, and may replace or be in addition to step 142. For example, it may be important for the manufacturer to ensure that the system interconnects are stable. Accordingly, with reference now to FIG. 4B, the method 120 may include steps of repeating steps 136–140 a certain number of iterations (i) (e.g., fifty iterations) separated by a certain interval (e.g., preferably one minute) (step 148), calculating a standard deviation for the repeated measured resistance data for each representative pin pair (step 150), and determining if the standard deviation exceeds a certain amount (step 152). If the standard deviation exceeds the certain amount, this is an indication that the system interconnects are not stable. Accordingly, the method 120 preferably rejects the circuit board (step 154) if the standard deviation exceeds the certain amount. The rejecting step 154 may include a warning (e g., that the resistance measurements do not meet the expected model). The method 120 may log the failure, e.g., indexed by the circuit board serial number, in a manufacturing database.

Another testing algorithm may compare the measured resistance data for all the pin pairs and determine if the data fit an expected Gaussian distribution, for example. If not, the circuit board could be rejected. Indeed, the complexity and detail of the testing algorithm(s) chosen are primarily only limited by the overhead costs allowed for the manufacturing testing process.

Figure 5:
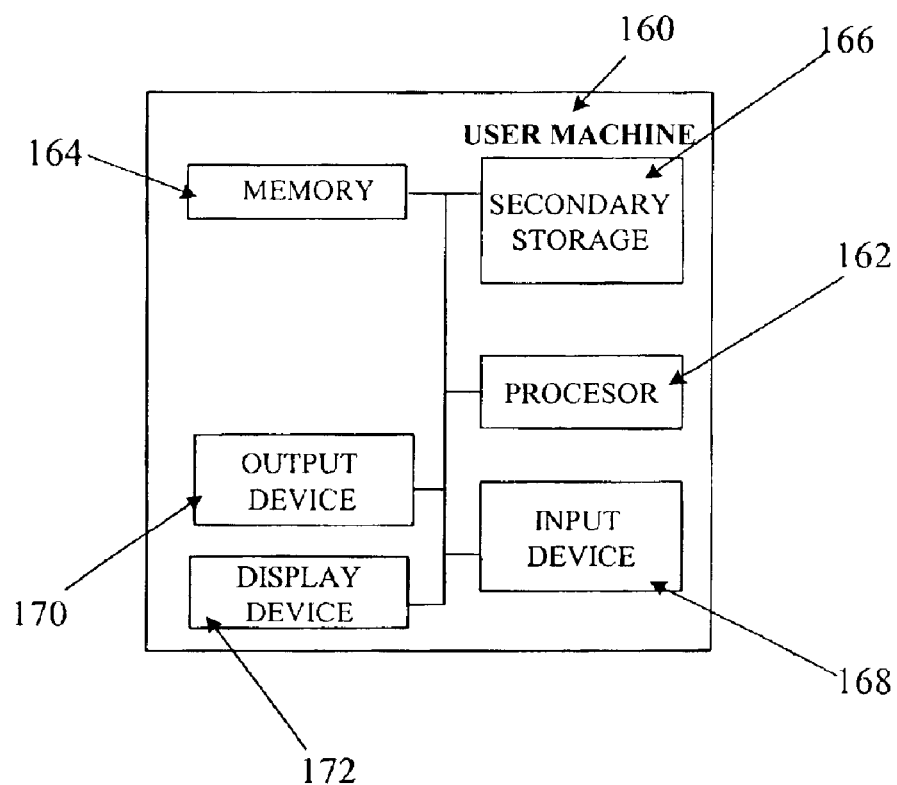

The above-described methods may be implemented as software. The software may be stored on a computer-readable medium as instructions for executing the above-described methods. Accordingly, with reference now to FIG. 5, illustrated is a user machine 160 that comprises a processor 162, a memory 164, a secondary storage device 166, an input device 168, an output device 170 and a display device 172. The processor 162 is preferably connected (e.g., via communications link 32) to a circuit board (e.g., circuit board 12) for which the methods will be executed. The instructions for executing the above-described methods are preferably stored in the secondary storage device 166 and, when executed by the processor 162, the memory 164. The memory 164 or secondary storage device 166 may include the register for storing the measured resistance data as well as the log for logging results. The memory 164 and secondary storage device 166 are computer-readable mediums.

The terms and descriptions used herein are set forth by way of illustration only and are not meant as limitations.

Those skilled in the art will recognize that many variations are possible within the spirit and scope of the invention as defined in the following claims, and their equivalents, in which all terms are to be understood in their broadest possible sense unless otherwise indicated.

What is claimed is:

1. A method for detecting high impedance failures in a system interconnect, comprising steps of:
   (a) measuring resistance of a connection of one or more representative sets of pins on a partitioned chip to a circuit board, wherein the measuring step is executed while the circuit board is operating, and wherein the measuring step comprises:
   partitioning the chip into a plurality of pin areas; and
   selecting the one or more representative sets of pins from pins within each pin area; and
   (b) determining if the measured resistance of each of the one or more representative sets of pins is less than a threshold value.

2. The method of claim 1, wherein step (b) determine that the measured resistance of each of the one or more representative sets of pins is less than the threshold value, the method further comprising:
   determining if the measured resistance of each of the one or more representative sets of pins is within a certain percentage of one another.

3. The method of claim 2, wherein the measure resistance of each of the one or more representative pins is not within the certain percentage of one another, the method further comprising:
   issuing a warning that the measured resistances do not match.

4. The method of claim 2, wherein the certain percentage is ten percent.

5. The method of claim 1, wherein step (b) determines that the measured resistance of any of the one or more representative sets of pins exceeds the threshold value, the method further comprising:
   determining if the exceeding measured resistance value(s) is less than a maximum allowable resistance value.

6. A method for detecting high impedance failures in a system interconnect, comprising steps of:
   (a) measuring resistance of a connection of one or more representative sets of pins on a partitioned chip to a circuit board, wherein the measuring step is executed while the circuit board is operating;
   (b) determining if the measured resistance of each of the one or more representative sets of pins is less than a threshold value, wherein the determining step determines that the measured resistance of any of the one or more representative sets of pins exceeds the threshold value;
   (c) determining if the exceeding measured resistance value(s) is less than a maximum allowable resistance value.
   (d) if the exceeding measured resistance value(s) is less than the maximum allowable resistance value, repeating step (a) a number of iterations each separated by an interval of time; and
   (e) determining if the measured resistance values from the repeating step are consistent with one another.

7. The method of claim 6, wherein the measured resistance values from the repeating step are consistent with one another, the method further comprising:
   issuing a severe warning indicating that an interconnect failure may occur soon.

8. The method of claim 6, wherein the measured resistance values from the repeating step are inconsistent with one another, the method further comprising:
   issuing a warning of inconsistency.

9. A method for detecting high impedance failures in a system interconnect, comprising steps of:
   (a) measuring resistance of a connection of one or more representative sets of pins on a partitioned chip to a circuit board, wherein the measuring step is executed while the circuit board is operating;
   (b) determining if the measured resistance of each of the one or more representative sets of pins is less than a threshold value, wherein the determining step determines that the measured resistance of any of the one or more representative sets of pins exceeds the threshold value;
   (c) determining if the exceeding measured resistance value(s) is less than a maximum allowable resistance value.
   (d) if any of the exceeding measured resistance value(s) is more than the maximum allowable resistance value, repeating step (a) a number of iterations each separated by an interval of time; and
   (e) determining if the measure resistance values from the repeating step are consistent with one another.

10. The method of claim 9, wherein the measured resistance values from the repeating step are consistent with one another, the method further comprising:
   issuing a critical warning indicating that an interconnect failure is imminent.

11. The method of claim 9, wherein the measured resistance values from the repeating step are inconsistent with one another, the method further comprising:
   issuing a warning of inconsistency.

12. The method of claim 1, further comprising steps of:
   waiting an interval; and
   repeating step (a) and step (b).

13. The method of claim 1, further comprising steps of:
   communicating the measured resistance data to a system management device; and
   storing the measured resistance data for each representative set of pins.

14. A method for detecting high impedance failures in a system interconnect, comprising steps of:
   (a) measuring resistance of a connection of one or more representative sets of pins on a partitioned chip to a circuit board, wherein the measuring step is executed while the circuit board is operating;
   (b) determining if the measured resistance of each of the one or more representative sets of pins is less than a threshold value;
   (c) determining a good resistance value (x); and
   (d) determining a maximum allowable resistance value (y);
   wherein the threshold value is a sum of the good resistance value and half of the maximum allowable resistance value minus the good resistance value $(x+(y-x)/2)$.

15. The method of claim 1, further comprising steps of:
   partitioning an application specific integrated circuit (ASIC) into pin areas; and
   routing a signal path from each of the one or more representative sets of pins to a resistance continuity monitoring circuit (RCMC).

16. The method of claim 1, further comprising a step of:

determining if the measured resistances of the one or more representative sets of pins fits a Gaussian distribution.

17. A computer-readable medium comprising instructions for:

(a) measuring resistance of a connection of one or more representative sets of pins on a partitioned chip to a circuit board, wherein the measuring step is executed while the circuit board is operating, and wherein the measuring step comprises:

partitioning the chip into a plurality of pin areas: and selecting the one or more representative sets of pins from pins within each pin area; and (b) determining if the measured resistance of each of the one or more representative sets of pins is less than a threshold value.

18. The computer-readable medium of claim 17 further comprising instructions for:

determining if the measured resistance of each of the one or more representative sets of pins is within a certain percentage of one another.

19. The computer-readable medium of claim 17 further comprising instructions for:

determining if an exceeding measured resistance value(s) is less than a maximum allowable resistance value.

20. A computer-readable medium comprising instructions for:

(a) measuring resistance of a connection of one or more representative sets of pins on a partitioned chip to a circuit board, wherein the measuring step is executed while the circuit board is operating;

(b) determining if the measured resistance of each of the one or more representative sets of pins is less than a threshold value;

(c) repeating step (a) a number of iterations each separated by an interval of time; and (d) determining if the measured resistance values from the repeating step are consistent with one another.

21. The computer-readable medium of claim 17 further comprising instructions for:

waiting an interval; and looping back to step (a).

* * * * *